United States Patent
Tanaka

(10) Patent No.: US 12,123,409 B2
(45) Date of Patent: Oct. 22, 2024

(54) ACTUATOR, FLUID CONTROL DEVICE, AND ACTUATOR MANUFACTURING METHOD

(71) Applicant: Murata Manufacturing Co., Ltd., Kyoto (JP)

(72) Inventor: Nobuhira Tanaka, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 139 days.

(21) Appl. No.: 17/930,440

(22) Filed: Sep. 8, 2022

(65) Prior Publication Data

US 2023/0006126 A1 Jan. 5, 2023

Related U.S. Application Data

(63) Continuation of application No. PCT/JP2021/000675, filed on Jan. 12, 2021.

(30) Foreign Application Priority Data

Mar. 18, 2020 (JP) .................................. 2020-047131

(51) Int. Cl.
*F04B 43/04* (2006.01)
*H10N 30/20* (2023.01)
*H10N 30/50* (2023.01)

(52) U.S. Cl.
CPC ........... *F04B 43/046* (2013.01); *H10N 30/20* (2023.02); *H10N 30/506* (2023.02)

(58) Field of Classification Search
CPC .. F04B 43/046; H10N 30/20; H10N 30/2047; H10N 30/506; H10N 30/87; B06B 1/06
See application file for complete search history.

(56) References Cited

U.S. PATENT DOCUMENTS 7,291,959 B2 * 11/2007 Miyazawa ............... H03H 3/08
310/317
2012/0171062 A1 7/2012 Kodama et al.
(Continued)

FOREIGN PATENT DOCUMENTS

CN 1983658 A * 6/2007 ............. F04B 43/04
JP 2000184496 A * 6/2000
(Continued)

OTHER PUBLICATIONS 2000-184496 (Year: 2000).*
(Continued)

*Primary Examiner* — Kenneth J Hansen
*Assistant Examiner* — Joseph S. Herrmann
(74) *Attorney, Agent, or Firm* — Pearne & Gordon LLP

(57) ABSTRACT

A first power supply member and a second power supply member are arranged on the same side of a first member in a thickness direction of an actuator. The first power supply member includes a first external connection terminal. The second power supply member includes a second external connection terminal. The first external connection terminal and the second external connection terminal are arranged on the same positions in the thickness direction. A second insulating layer is arranged between the second power supply member and a frame body. A far end side portion on an opposite side to a side, on which the first external connection terminal protrudes, in the first power supply member is bent toward the frame body to be electrically connected with the frame body.

20 Claims, 6 Drawing Sheets

(56) References Cited

U.S. PATENT DOCUMENTS

| | | | |
|---|---|---|---|
| 2017/0058882 A1* | 3/2017 | Hirata | .................. F04B 43/046 |
| 2017/0219120 A1 | 8/2017 | Chen et al. | |
| 2018/0066650 A1 | 3/2018 | Fujisaki et al. | |
| 2021/0280769 A1* | 9/2021 | Wu | ..................... H10N 30/875 |

FOREIGN PATENT DOCUMENTS

| | | | |
|---|---|---|---|
| JP | 2007307572 A | * | 11/2007 |
| JP | 2008-173546 A | | 7/2008 |
| JP | 2017-133507 A | | 8/2017 |
| WO | 2011/145544 A1 | | 11/2011 |
| WO | 2016/175185 A1 | | 11/2016 |

OTHER PUBLICATIONS 2007-307527 (Year: 2007).*
CN 1983658 (Year: 2007).*
International Search Report for PCT/JP2021/000675 dated Apr. 6, 2021.

* cited by examiner

FIG. 7A
FIG. 7B
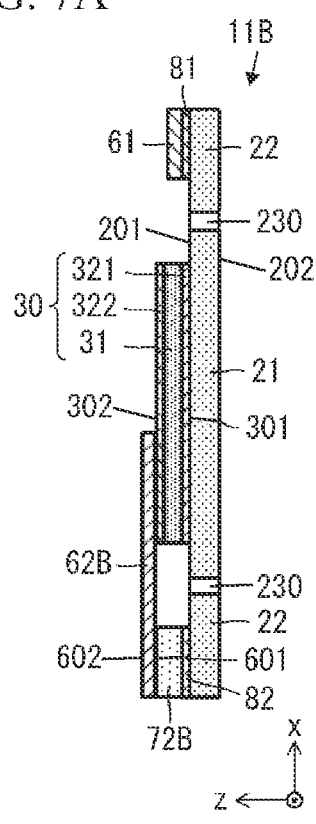
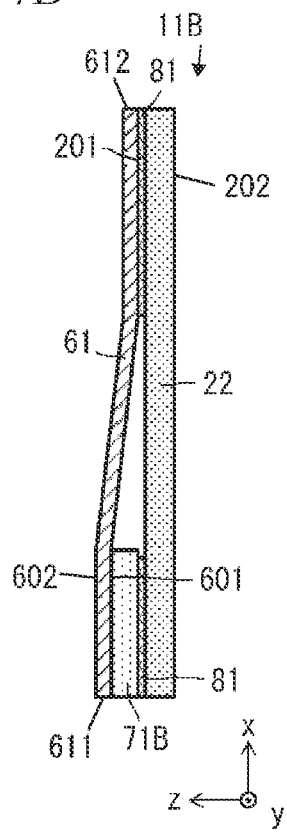

ACTUATOR, FLUID CONTROL DEVICE, AND ACTUATOR MANUFACTURING METHOD

CROSS REFERENCE TO RELATED APPLICATION

This is a continuation of International Application No. PCT/JP2021/000675 filed on Jan. 12, 2021 which claims priority from Japanese Patent Application No. 2020-047131 filed on Mar. 18, 2020. The contents of these applications are incorporated herein by reference in their entireties.

BACKGROUND OF THE DISCLOSURE

Field of the Disclosure

The present disclosure relates to an actuator that vibrates a flat plate with a piezoelectric element.

Description of the Related Art

Patent Document 1 discloses a pump using a piezoelectric element. The pump described in Patent Document 1 includes a piezoelectric element, a vibration plate, a power supply plate, and an opposing plate.

The vibration plate includes a disk, a frame body, and a coupling portion. The frame body is arranged to surround the disk and is coupled to an outer edge of the disk by the coupling portion. The coupling portion has a beam shape and supports the disk with respect to the frame body so that the disk can vibrate.

The piezoelectric element is arranged on one main surface of the disk in the vibration plate. The power supply plate is arranged on an opposite side to the side having the vibration plate in the piezoelectric element. An internal connection terminal of the power supply plate is connected to a surface, which is on an opposite side to the side having the vibration plate, of the piezoelectric element.

The opposing plate is arranged on an opposite side to a side, on which the piezoelectric element is arranged, of the vibration plate. The opposing plate is connected with the frame body in the vibration plate.

An external connection terminal is provided to each of the power supply plate and the opposing plate, supplying a drive signal to the piezoelectric element.

Patent Document 1: International Publication No. 2016/175185

BRIEF SUMMARY OF THE DISCLOSURE

However, in the conventional configuration as that described in Patent Document 1, two pieces of external connection terminals are arranged on mutually-different positions in a thickness direction (a direction orthogonal to a main surface) of a pump. Therefore, wiring from the outside to the two external connection terminals is not easy.

Further, it has been difficult to realize the supply of a drive signal to power supply surfaces (two main surfaces) of a piezoelectric element, which are on mutually-different positions in the thickness direction of the pump, while matching the positions of the two external connection terminals in the thickness direction, with a simple configuration.

Accordingly, a possible benefit of the present disclosure is to provide an actuator that can more securely realize the supply of a drive signal to a piezoelectric element while matching the positions of two external connection terminals in a thickness direction of the device, with a simple configuration.

An actuator according to the present disclosure includes a first member, a piezoelectric element, a first power supply member, a second power supply member, and an insulating layer. The first member is composed of a conductive plate having a first main surface and a second main surface and includes a first flat plate, a frame body surrounding the first flat plate, and a coupling member which is connected with an outer edge of the first flat plate and the frame body and couples the first flat plate to the frame body. The piezoelectric element has a third main surface and a fourth main surface, the third main surface facing the first main surface of the first flat plate, and is arranged on the first flat plate. The first power supply member is arranged on a first main surface side of the first member and is connected with the frame body of the first member. The second power supply member is arranged on a same side as the first power supply member on the first member and has a portion connected with the fourth main surface and a portion overlapped with the frame body. The insulating layer is arranged between the second power supply member and the frame body. When a direction in which the first power supply member and the second power supply member are aligned with respect to the piezoelectric element is defined as a thickness direction, the first power supply member includes a first external connection terminal that protrudes in a direction orthogonal to the thickness direction. The second power supply member includes a second external connection terminal that protrudes in the direction orthogonal to the thickness direction. The first external connection terminal and the second external connection terminal are arranged on same positions in the thickness direction. A portion on an opposite side to a side, on which the first external connection terminal protrudes, in the first power supply member is bent toward the frame body to be electrically connected with the frame body.

In this configuration, the position of the first external connection terminal and the position of the second external connection terminal are the same as each other in the thickness direction of the actuator and the first power supply member is directly connected with the frame body and accordingly is connected to the piezoelectric element and the second power supply member is directly connected with the piezoelectric element.

According to the present disclosure, the supply of a drive signal to a piezoelectric element can be more securely realized while matching the positions of two external connection terminals in a thickness direction of a device, with a simple configuration.

BRIEF DESCRIPTION OF THE SEVERAL VIEWS OF THE DRAWINGS

FIGS. 7A and 7B are side sectional views of an actuator 11B according to a third embodiment.

DETAILED DESCRIPTION OF THE DISCLOSURE

First Embodiment

Figure 1:
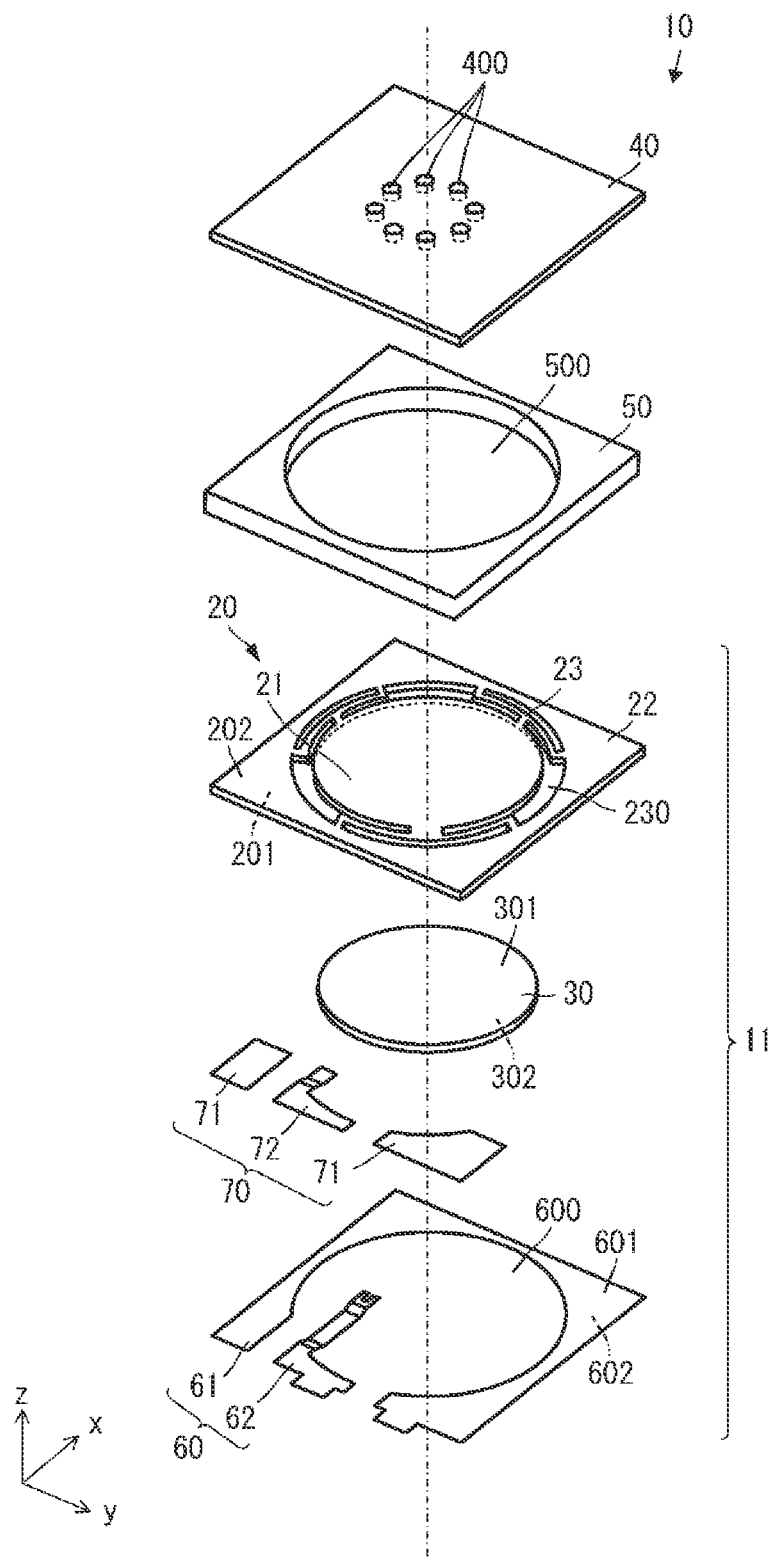
FIG. 1 is an exploded perspective view of a fluid control device 10 including an actuator 11 according to a first embodiment.
Figure 2:
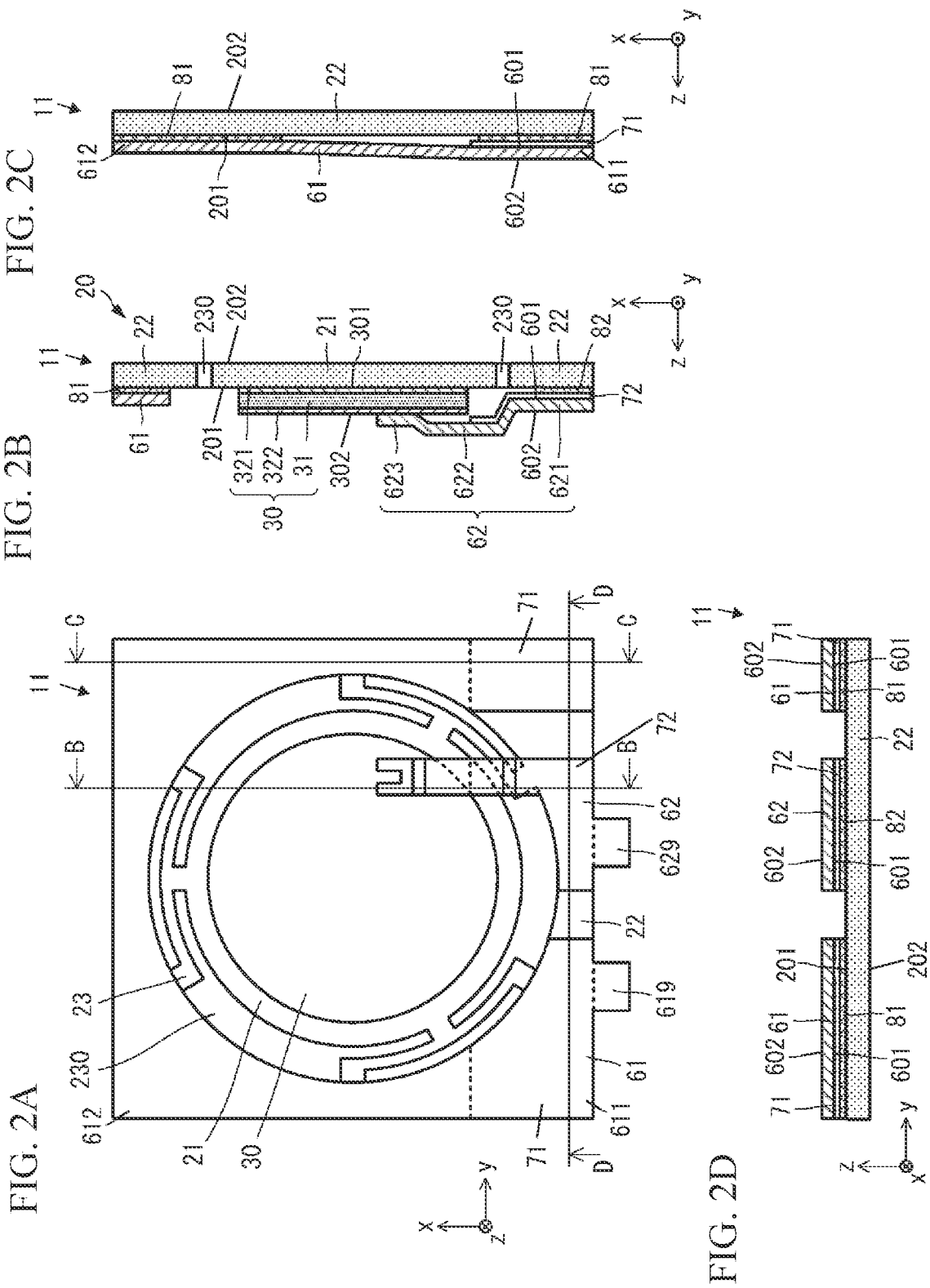
FIG. 2A is a plan view of the actuator 11 according to the first embodiment and FIGS. 2B, 2C, and 2D are side sectional views of the actuator 11.
Figure 3:
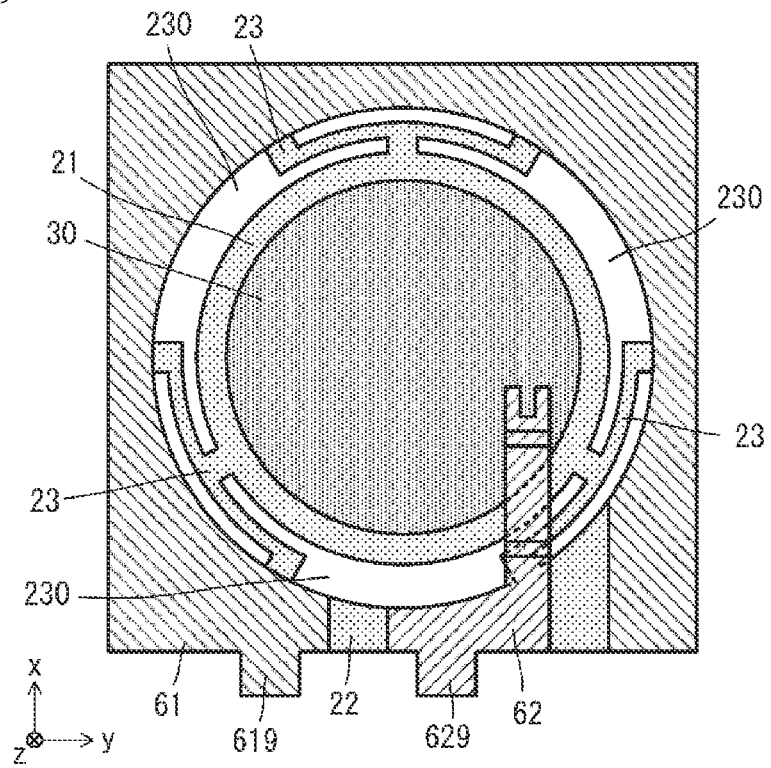
FIG. 3 is a plan view illustrating components of the actuator 11 according to the first embodiment with respectively-different hatching.

An actuator and a fluid control device according to a first embodiment of the present disclosure will be described with reference to the accompanying drawings. FIG. 1 is an exploded perspective view of a fluid control device 10 including an actuator 11 according to a first embodiment. FIG. 2A is a plan view of the actuator 11 according to the first embodiment and FIGS. 2B, 2C, and 2D are side sectional views of the actuator 11. FIG. 3 is a plan view illustrating components of the actuator 11 according to the first embodiment with respectively-different hatching. Here, each drawing partially or entirely exaggerates the shapes of respective components to facilitate understanding of the configurations of the actuator and the fluid control device.
(Configuration of Actuator 11)

As illustrated in FIG. 1, FIGS. 2A, 2B, 2C, and 2D, and FIG. 3, the actuator 11 includes a first member 20, a piezoelectric element 30, a power supply member 60, and an insulating layer 70.
(Configuration of First Member 20)

The first member 20 is a conductive plate and has a main surface 201 and a main surface 202. The main surface 201 corresponds to a "first main surface" of the present disclosure and the main surface 202 corresponds to a "second main surface" of the present disclosure. The first member 20 includes a first flat plate 21, a frame body 22, and a plurality of coupling members 23.

The first flat plate 21 is a flat plate whose shape in plan view (shape viewed in a thickness direction) is circular.

The frame body 22 is a flat plate and is arranged outside an outer edge of the first flat plate 21 when viewed from the center of the first flat plate 21. In plan view, the frame body 22 surrounds the first flat plate 21. In other words, the frame body 22 has a circular opening on the center and the first flat plate 21 is arranged in this opening. The shape of the opening is similar to an outer shape of the first flat plate 21 and is larger than the outer shape of the first flat plate 21. The outer shape of the frame body 22 is, for example, rectangular, but the outer shape of the frame body 22 is not limited to be rectangular.

The plurality of coupling members 23 have a beam shape. The plurality of coupling members 23 are arranged between the first flat plate 21 and the frame body 22. The plurality of coupling members 23 are connected with the outer edge of the first flat plate 21 and an inner edge of the frame body 22. The plurality of coupling members 23 are arranged at intervals along the outer edge of the first flat plate 21. Here, the number of coupling members 23 is any as long as the number is three or greater and the plurality of coupling members 23 may be arranged at equal intervals along an outer circumference of the first flat plate 21.

A plurality of gaps 230 penetrate the first member 20 from the main surface 201 to the main surface 202. The plurality of gaps 230 are arranged between the first flat plate 21 and the frame body 22. The plurality of gaps 230 are portions that are surrounded by the first flat plate 21, the frame body 22, and the plurality of coupling members 23 in a region between the first flat plate 21 and the frame body 22.

In the configuration described above, through the plurality of gaps 230, a space on the main surface 201 side of the first flat plate 21 and a space on the main surface 202 side communicate with each other. Further, the plurality of coupling members 23 are formed with the plurality of gaps 230 interposed therebetween and accordingly, the plurality of coupling members 23 easily deform. That is, the plurality of coupling members 23 couple the first flat plate 21 to the frame body 22 so that the first flat plate 21 can vibrate. The vibration of the first flat plate 21 in this example is bending vibration that is vibration with which the main surface 201 and the main surface 202 are displaced in a wavy pattern when viewing the first flat plate 21 from the side (viewing the first flat plate 21 in a direction orthogonal to the thickness direction).
(Configuration of Piezoelectric Element 30)

As illustrated in FIG. 2B, the piezoelectric element 30 includes a piezoelectric material 31, a drive electrode 321, and a drive electrode 322. The piezoelectric material 31 is a circular flat plate. The drive electrode 321 is formed on one main surface of the piezoelectric material 31 having the flat plate shape and the drive electrode 322 is formed on the other main surface of the piezoelectric material 31 having the flat plate shape. An outer main surface 301 on the drive electrode 321 side in the piezoelectric element 30 corresponds to a "third main surface" of the present disclosure and an outer main surface 302 on the drive electrode 322 side in the piezoelectric element 30 corresponds to a "fourth main surface" of the present disclosure.
(Configuration of Power Supply Member 60)

Figure 4:
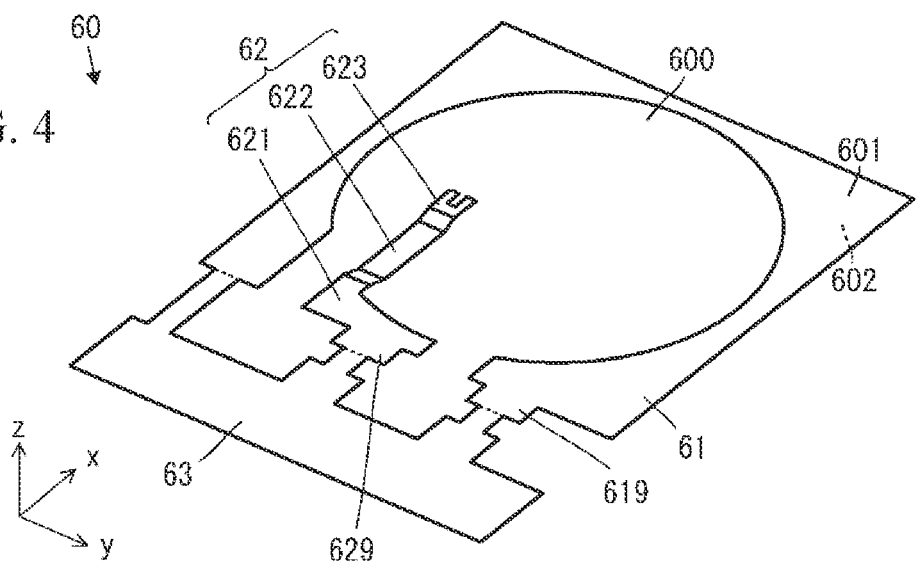
FIG. 4 is a perspective view of a power supply member 60.

FIG. 4 is a perspective view of the power supply member 60. The power supply member 60 is a conductive plate having a main surface 601 and a main surface 602. The power supply member 60 includes a first power supply member 61 and a second power supply member 62. The first power supply member 61 and the second power supply member 62 are arranged on the same positions in a z direction (see each drawing) that is the thickness direction of the actuator 11.

The outer shape of the first power supply member 61 is substantially the same as the outer shape of the first member 20 and the first power supply member 61 has an opening 600 on the center thereof. The opening 600 has substantially the same shape as the shape (inner shape) of the frame body 22 of the first member 20 on the side at which the frame body 22 is connected with the coupling members 23. In other words, the opening 600 has substantially the same shape as a shape obtained by combining the first flat plate 21 of first member 20, the plurality of coupling members 23, and the plurality of gaps 230. Here, it is enough that the opening 600 has the same shape as or a larger shape than the inner shape of the frame body 22.

The opening 600 communicates with the outside of the first power supply member 61 in an x direction (see each drawing) that is one direction orthogonal to the thickness direction. In other words, the first power supply member 61 has an arc shape obtained by partially cutting off an annular shape on one side of the x direction.

The first power supply member 61 includes a first external connection terminal 619. The first external connection terminal 619 has a rectangular shape that protrudes in the x direction from an end portion, on the side on which there is a cut portion, of the first power supply member 61. The first external connection terminal 619 is arranged on the same position as the first power supply member 61 in the z direction.

The second power supply member 62 includes a first portion 621, a second portion 622, and a third portion 623 and is formed in a manner such that the first portion 621, the second portion 622, and the third portion 623 are integrated with each other. The first portion 621 is positioned to be overlapped with the frame body 22 in plan view together with the first power supply member 61 and forms a portion of the outer shape of the opening 600 together with the frame body 22. The second portion 622 and the third portion 623 have a belt shape extending in the x direction.

One end portion, in the x direction, of the second portion 622 is connected with the first portion 621 and the other end portion is connected with the third portion 623. The second portion 622 has portions curved in the z direction and a portion extending in the x direction. The portions curved in the z direction are connected with respective end portions of the portion extending in the x direction. The second portion 622 is connected with the first portion 621 and the third portion 623 with the portions curved in the z direction respectively.

Thus, the second power supply member 62 has a curved portion that is partially recessed in the z direction in the middle of an extending direction (the x direction) when viewed from the main surface 601 side, in other words, that partially protrudes in the z direction when viewed from the main surface 602 side.

The first portion 621 of the second power supply member 62 is arranged on a portion on which the annular shape is cut off in the first power supply member 61. The first portion 621 is separated from the first power supply member 61. The second portion 622 is arranged so as to protrude toward the inner side of the opening 600 and the third portion 623 is arranged on the protruding end of the second portion 622.

The second power supply member 62 includes a second external connection terminal 629. The second external connection terminal 629 has a rectangular shape that protrudes in the x direction from an end portion, on the opposite side to the side on which the second portion 622 protrudes, of the first portion 621. The second external connection terminal 629 is arranged on the same position as the first portion 621 of the second power supply member 62 in the z direction. Thus, the second external connection terminal 629 and the first external connection terminal 619 are arranged on the same positions in the z direction (the thickness direction of the actuator 11). The configuration in which the second external connection terminal 629 and the first external connection terminal 619 are on the same positions in the z direction (the thickness direction of the actuator 11) is preferably the configuration in which the second external connection terminal 629 and the first external connection terminal 619 are on the same positions so that both main surfaces of the second external connection terminal 629 and both main surfaces of the first external connection terminal 619 are completely accorded with each other respectively. However, the configuration is not limited to this. The configuration may include a configuration in which the second external connection terminal 629 and the first external connection terminal 619 are arranged so that the position of the second external connection terminal 629 in the thickness direction and the position of the first external connection terminal 619 in the thickness direction are at least partially overlapped with each other on thereof.

The first power supply member 61 and the second power supply member 62 are molded in a manner to be mutually connected by a connecting member 63, as illustrated in FIG. 4. Then, after the actuator 11 is assembled, more specifically, after the first power supply member 61 is connected to the frame body 22 and the second power supply member 62 is connected to the piezoelectric element 30, the first power supply member 61 and the second power supply member 62 are separated into pieces. Thus, the actuator 11 can be assembled while maintaining a stable positional relation between the first power supply member 61 and the second power supply member 62.

In this configuration, the connecting member 63 is coupled to the first power supply member 61 and the second power supply member 62 via the first external connection terminal 619 and the second external connection terminal 629 respectively.

(Configuration of Insulating Layer 70)

The insulating layer 70 has an insulating property and has a film shape. The insulating layer 70 is made, for example, of resin whose main constituent is any one of epoxy, polyimide, polyamide-imide, polyester, polyethersulfone, and the like. The insulating layer 70 includes a first insulating layer 71 and a second insulating layer 72. The first insulating layer 71 has substantially the same shape as that of a portion, on the side on which the first external connection terminal 619 is provided, of the first power supply member 61. The second insulating layer 72 has substantially the same shape as that of a portion obtained by combining the first portion 621 and part of the second portion 622 of the second power supply member 62.

(Arrangement and Connecting Relation of Components of Actuator 11)

The piezoelectric element 30 is arranged on the main surface 201 of the first flat plate 21. Specifically, the outer main surface 301 of the piezoelectric element 30 faces the main surface 201 of the first flat plate 21, and the drive electrode 321 and the first flat plate 21 are bonded to each other with a conductive bonding agent. Here, the bonding agent of the present application includes an adhesive. In plan view of the actuator 11, the center of the piezoelectric element 30 and the center of the first flat plate 21 are substantially accorded with each other. The piezoelectric element 30 is distorted when a drive signal is applied to the drive electrodes 321 and 322. This distortion generates the vibration of the first flat plate 21 as described above.

The power supply member 60 is arranged on the main surface 201 side of the first member 20. In other words, the power supply member 60 is arranged on the side on which the piezoelectric element 30 is arranged, in the first member 20.

The power supply member 60 is arranged so that the main surface 601 faces the main surface 201 of the first member 20. Accordingly, the second power supply member 62 is arranged so that the second portion 622 is separated from the piezoelectric element 30 in the z direction more than the first portion 621 and the third portion 623. In other words, the second power supply member 62 has a curved portion that is separated from the piezoelectric element 30 in the thickness direction of the actuator 11, in the middle of the extending direction thereof.

More specifically, the first power supply member 61 and the second power supply member 62 are arranged as follows when viewed in the z direction. The first power supply member 61 is arranged so as to be overlapped with the frame body 22 of the first member 20. The first portion 621 of the second power supply member 62 is arranged so as to be overlapped with the frame body 22. The third portion 623 of the second power supply member 62 is arranged so as to be overlapped with the piezoelectric element 30. The third portion 623 is abutted on the outer main surface 302 of the piezoelectric element 30.

A near end side portion 611 (mainly see FIG. 2A and FIG. 2C) on the side having the first external connection terminal 619 in the first power supply member 61 is physically connected with the frame body 22 with the first insulating layer 71 interposed therebetween. More specifically, the first insulating layer 71 is formed on the main surface 601 at the near end side portion 611 of the first power supply member 61. A surface of the first insulating layer 71 (an opposite surface to the surface abutted on the near end side portion 611) is bonded to the frame body 22 with adhesive 81.

A far end side portion 612 (mainly see FIG. 2A and FIG. 2C) on the opposite side to the side having the first external connection terminal 619 in the first power supply member 61 is physically and electrically connected with the frame body 22. More specifically, an insulating layer is not formed on the far end side portion 612. The first power supply member 61 is bent so that the far end side portion 612 is closer to the frame body 22 than the near end side portion 611. In this state, the main surface 601 at the far end side portion 612 is bonded to the frame body 22 with the adhesive 81. Here, the adhesive 81 is conductive (for example, containing conductive filler) and accordingly, the far end side portion 612 and the frame body 22 are physically and electrically connected with each other. That is, the first power supply member 61 and the frame body are fixed to the frame body 22 in a state in which the first power supply member 61 and the frame 22 are physically and electrically connected, and the first power supply member 61 is fixed to the frame 22.

The second power supply member 62 (mainly see FIG. 2A, FIG. 2B, and FIG. 2D) is physically connected with the frame body 22 with the second insulating layer 72 interposed therebetween. More specifically, the second insulating layer 72 is formed on the main surface 601 on the whole of the first portion 621 and part of the second portion 622 in the second power supply member 62. A surface of the second insulating layer 72 (an opposite surface to the surface abutted on the first portion 621) is bonded to the frame body 22 with adhesive 82. Accordingly, the second power supply member 62 is fixed to the frame body 22 in a state in which the second power supply member 62 is insulated from the frame body 22.

In the above-described configuration, the drive electrode 321 of the piezoelectric element 30 is connected with the first external connection terminal 619 via the first member 20 and the first power supply member 61. The drive electrode 322 of the piezoelectric element 30 is connected with the second external connection terminal 629 via the second power supply member 62. Accordingly, a drive signal can be supplied to the piezoelectric element 30 from the outside.

Further, the thickness of the first insulating layer 71 and the thickness of the second insulating layer 72 are the same as each other in this configuration. Therefore, the position of the first external connection terminal 619 and the position of the second external connection terminal 629 are the same in the thickness direction of the actuator 11. This facilitates wiring to the first external connection terminal 619 and the second external connection terminal 629 from the outside. Here, the definition that positions are the same in this description includes a range of an error caused by manufacturing variations.

When the adhesive 81 and the adhesive 82 are omitted in this configuration, the position of the first external connection terminal 619 and the position of the second external connection terminal 629 can be more precisely matched in the thickness direction of the actuator 11. In this configuration, the first power supply member 61 may be any power supply member as long as the power supply member can maintain its bent shape. For example, the first power supply member 61 may be metal or the like that has conductivity and can be plastically deformed. However, with the use of the adhesive 81 and the adhesive 82, the first power supply member 61 and the second power supply member 62 are more securely fixed and the conduction between the first power supply member 61 and the frame body 22 is further secured.

More precisely, when the thickness of the adhesive 81 and the thickness of the adhesive 82 are the same as each other, the position of the first external connection terminal 619 and the position of the second external connection terminal 629 are matched. However, the thickness of the adhesive 81 and the thickness of the adhesive 82 can be generally made substantially the same as each other by performing manufacturing control such as using the same adhesive as the adhesive 81 and the adhesive 82. Thus, the position of the first external connection terminal 619 and the position of the second external connection terminal 629 can be matched within the range of the above-mentioned definition that the positions are the same.

The first power supply member 61 including the first external connection terminal 619 and the second power supply member 62 including the second external connection terminal 629 are on the same positions in the thickness direction of the actuator 11 in this configuration. Accordingly, the actuator can be downsized compared to the related art in which members for supplying drive signals to two drive electrodes of a piezoelectric element are arranged on different positions in the thickness direction of the actuator 11 with the piezoelectric element interposed therebetween. Further, this configuration makes it possible to supply a drive signal to the piezoelectric element without complicating a drive-signal supplying path. In other words, the actuator 11 can supply a drive signal to the piezoelectric element with the simple configuration, thus being able to realize further secure supply of a drive signal with the simple configuration.

Further, the second power supply member 62 has the above-described curved portion in this configuration. Accordingly, the third portion 623 is pressed against the outer main surface 302 of the piezoelectric element 30 with a predetermined urging force. This improves the stability of the physical and electrical connections between the third portion 623 and the piezoelectric element 30. Especially, if the thickness of the second insulating layer 72 is less than the thickness of the piezoelectric element 30, the second portion 622 and the third portion 623 of the second power supply member 62 are pushed up by the piezoelectric element 30 in a non-driving state. Thus, the second power supply member 62 can more securely apply the urging force to the piezoelectric element 30. This further improves the stability of the physical and electrical connections between the third portion 623 and the piezoelectric element 30.

Further, the first power supply member 61 and the second power supply member 62 are assembled to the first member 20 in an integrated manner as a single power supply member 60, as described above. Then, the single power supply member 60 is divided into the first power supply member 61 and the second power supply member 62 after the assembling. Accordingly, the actuator 11 can be assembled while maintaining the positional relation between the first power supply member 61 and the second power supply member 62 with high precision. Thus, the configuration in which the first power supply member 61 is connected to the frame body 22 and the second power supply member 62 is connected to the piezoelectric element 30 can be highly precisely and easily realized.

Further, the first insulating layer 71 and the second insulating layer 72 may be formed together with the power supply member 60 in the above-described configuration. That is, the first insulating layer 71 and the second insulating layer 72 are formed by application in a strip shape, printing, or attaching an insulating tape having a predetermined width in a state of the power supply member 60, more specifically, in a state of a flat plate on which the opening 600 or the like is not formed yet. Accordingly, the first insulating layer 71 and the second insulating layer 72 can be more securely formed in a predetermined region. Also, the thickness of the first insulating layer 71 and the thickness of the second insulating layer 72 can be more securely made the same as each other.

(Configuration of Fluid Control Device 10)

The fluid control device 10 can be configured as illustrated in FIG. 1 by employing the actuator 11 having the above-described configuration. The fluid control device 10 includes the actuator 11, a second flat plate 40, and a side wall member 50.

The second flat plate 40 is arranged on the main surface 202 side of the first member 20 of the actuator 11. The second flat plate 40 has a plurality of through holes 400.

The side wall member 50 has a hollow 500 to have an annular shape and is arranged between the first member 20 of the actuator 11 and the second flat plate 40. The side wall member 50 is connected with the frame body 22 of the first member 20 and the second flat plate 40. Accordingly, a space surrounded by the actuator 11, the side wall member 50, and the second flat plate 40 (the hollow 500 of the side wall member 50) is a pump chamber. The pump chamber communicates with an outside space on the second flat plate 40 side of the fluid control device 10 through the plurality of through holes 400. Further, the pump chamber communicates with an outside space on the actuator 11 side of the fluid control device 10 through the plurality of gaps 230.

Second Embodiment

Figure 5:
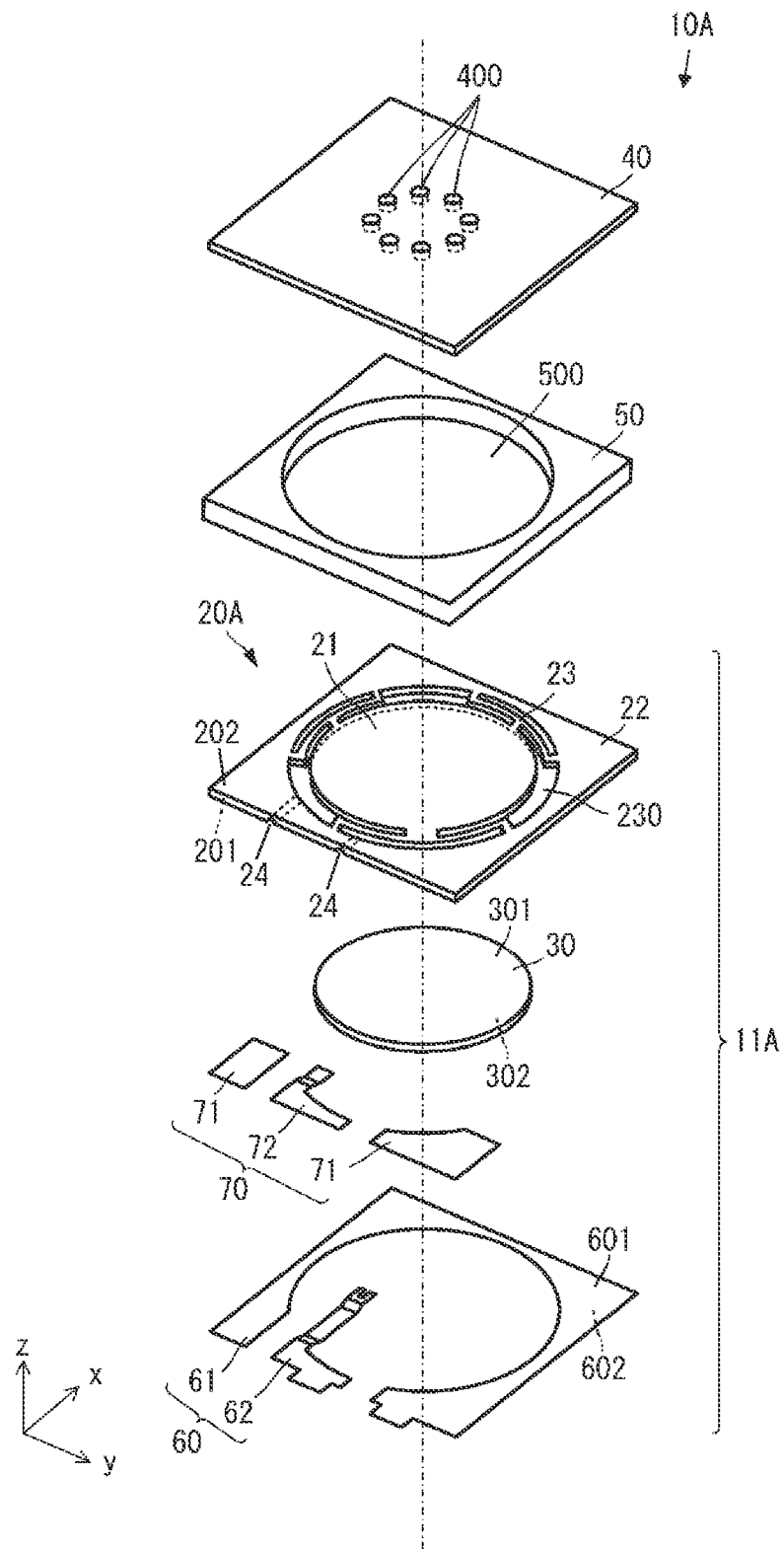
FIG. 5 is an exploded perspective view of a fluid control device 10A including an actuator 11A according to a second embodiment.
Figure 6A:
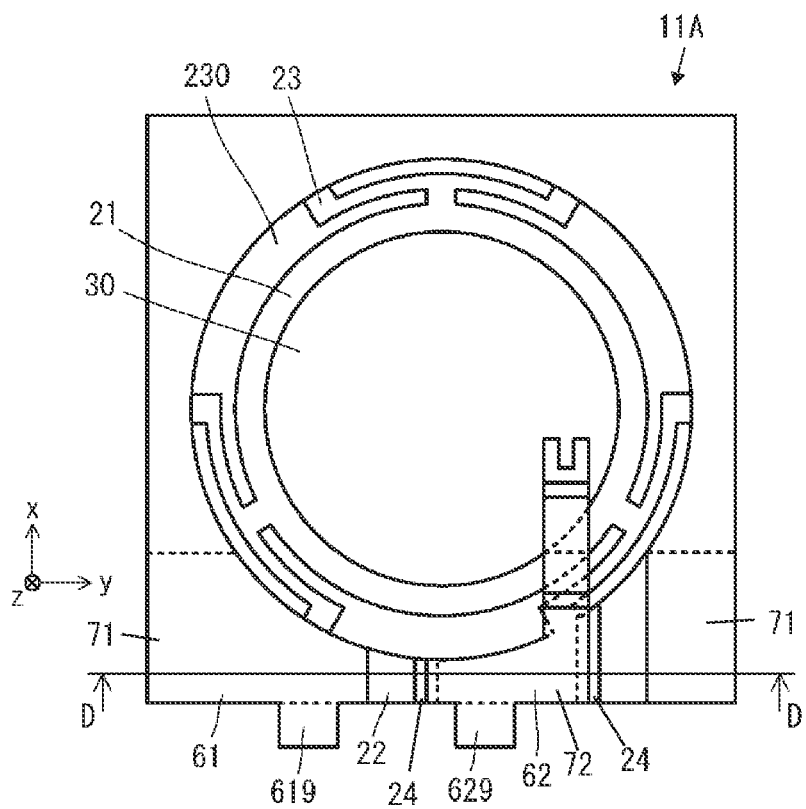
FIG. 6A is a plan view of the actuator 11A according to the second embodiment and FIG. 6B is a side sectional view of the actuator 11A.
Figure 6B:
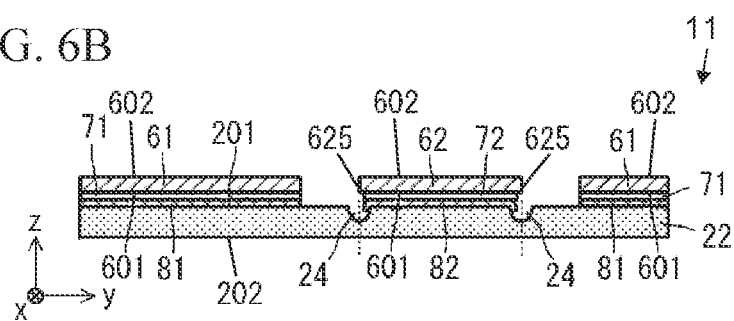

An actuator and a fluid control device according to a second embodiment of the present disclosure will be described with reference to the accompanying drawings. FIG. 5 is an exploded perspective view of a fluid control device 10A including an actuator 11A according to the second embodiment. FIG. 6A is a plan view of the actuator 11A according to the second embodiment and FIG. 6D is a side sectional view of the actuator 11A.

The fluid control device 10A according to the second embodiment is different from the fluid control device 10 according to the first embodiment in the configuration of the actuator 11A as illustrated in FIG. 5 and FIGS. 6A and 6D. Other configurations of the fluid control device 10A are the same as those of the fluid control device 10 and the description of the same portions will be omitted. The actuator 11A is different from the actuator 11 according to the first embodiment in the configuration of a first member 20A. Other configurations of the actuator 11A are the same as those of the actuator 11 and the description of the same portions will be omitted.

The first member 20A has a plurality of concave portions 24 on the frame body 22. The plurality of concave portions 24 has a shape that is concaved from the main surface 201 and extends in the x direction.

The plurality of concave portions 24 are formed on positions, on which the first portion 621 of the second power supply member 62 is arranged, in the frame body 22. More specifically, the concave portions 24 are overlapped with side end portions 625 of the first portion 621 of the second power supply member 62 in plan view (when viewed in the z direction) of the actuator 11A.

With this configuration, the actuator 11A can more securely realize the supply of a drive signal to the piezoelectric element 30 with the simple configuration while matching the positions of two external connection terminals in the z direction (thickness direction), as is the case with the actuator 11.

Further, the side end portions of the second insulating layer 72 are on the inner side than the side end portions 625 of the first portion 621 in this configuration. Therefore, even though the surface, which is closer to the frame body 22, of the first portion 621 is exposed, the concave portion 24 increases a distance from the frame body 22. Accordingly, the short circuit between the first portion 621 and the frame body 22 can be suppressed. This is especially effective, for example, when employing the manufacturing method that separates the first power supply member 61 and the second power supply member 62 after forming the first insulating layer 71 and the second insulating layer 72 as described above. In this manufacturing method, a portion, near a cut surface, of the second insulating layer 72 may be chipped in cutting out the first power supply member 61 and the second power supply member 62. If the chipping occurs, the second insulating layer 72 at the side end portion 625 of the first portion 621 is dropped, as described above. In such a case, the above-mentioned formation of the concave portions 24 can suppress the short circuit between the first portion 621 of the second power supply member 62 and the frame body 22. Further, the side end portions of the adhesive 82 enter the concave portions 24 in this configuration, being able to suppress the short circuit between the first portion 621 of the second power supply member 62 and the frame body 22 through the adhesive 82, as well.

Third Embodiment

An actuator and a fluid control device according to a third embodiment of the present disclosure will be described with reference to the accompanying drawings. FIGS. 7B and 7C are side sectional views of an actuator 11B according to the third embodiment.

The actuator 11B according to the third embodiment is different from the actuator 11 according to the first embodiment in configurations of a second power supply member 62B, a first insulating layer 71B, and a second insulating layer 72B, as illustrated in FIGS. 7B and 7C. Other configurations of the actuator 11B are the same as those of the actuator 11 and the description of the same portions will be omitted.

The second power supply member 62B is different from the second power supply member 62 according to the first embodiment in that the second power supply member 62B does not have a curved portion. That is, the second power supply member 62B is a flat plate having only a flat surface.

The thickness of the first insulating layer 71B and the thickness of the second insulating layer 72B are substantially the same as the thickness of the piezoelectric element 30.

Even with this configuration, the actuator 11B can more securely realize the supply of a drive signal to the piezoelectric element 30 with the simple configuration while matching the positions of two external connection terminals in the z direction (thickness direction), as is the case with the actuator 11.

10, 10A fluid control device
11, 11A, 11B actuator
20, 20A first member
21 first flat plate
22 frame body
23 coupling member
24 concave portion
30 piezoelectric element
31 piezoelectric material
40 second flat plate
50 side wall member
60 power supply member
61 first power supply member
62, 62B second power supply member
63 connecting member
70 insulating layer
71, 71B first insulating layer
72, 72B second insulating layer
81, 82 adhesive
201, 202 main surface
230 gap
301, 302 outer main surface
321, 322 drive electrode
400 through hole
500 hollow
600 opening
601, 602 main surface
611 near end side portion
612 far end side portion
619 first external connection terminal
621 first portion
622 second portion
623 third portion
625 side end portion
629 second external connection terminal

The invention claimed is:

1. An actuator comprising:
a first member composed of a conductive plate having a first main surface and a second main surface, the first member including a first flat plate, a frame body surrounding the first flat plate, and a coupling member, the coupling member being connected with an outer edge of the first flat plate and the frame body and coupling the first flat plate to the frame body;
a piezoelectric element having a third main surface and a fourth main surface and arranged on the first flat plate, the third main surface facing the first main surface of the first flat plate;
a first power supply member arranged on a first main surface side of the first member and connected with the frame body of the first member;
a second power supply member arranged on a same side as the first power supply member on the first member and having a portion connected with the fourth main surface and a portion overlapped with the frame body; and
an insulating layer arranged between the second power supply member and the frame body in a portion where the second power supply member and the frame body are overlapped, wherein
when a direction in which the first power supply member and the second power supply member are aligned with respect to the piezoelectric element is defined as a thickness direction,
the first power supply member includes a first external connection terminal protruding in a direction orthogonal to the thickness direction,
the second power supply member includes a second external connection terminal protruding in the direction orthogonal to the thickness direction,
the first and second external connection terminals are arranged on a common plane that is perpendicular to the thickness direction, and
the first power supply member has a bent portion, wherein the bent portion is bent toward the frame body to be electrically connected to the frame body, the bent portion being located on a side of the first power supply member that is opposite to a side on which the first external connection terminal protrudes.

2. A fluid control device comprising:
the actuator according to claim 1;
a second flat plate arranged on a second main surface side of the first member and having a through hole; and
a side wall member connected with the second flat plate and the frame body and providing a pump chamber together with the first member and the second flat plate.

3. The actuator according to claim 1, wherein
the frame body has a concave portion concaved from the first main surface, and
the concave portion is overlapped with a side end portion of the second power supply member when viewed in the thickness direction.

4. A fluid control device comprising:
the actuator according to claim 3;
a second flat plate arranged on a second main surface side of the first member and having a through hole; and
a side wall member connected with the second flat plate and the frame body and providing a pump chamber together with the first member and the second flat plate.

5. The actuator according to claim 1, further comprising:
an adhesive bonding the first power supply member to the frame body and having conductivity.

6. A fluid control device comprising:
the actuator according to claim 5;
a second flat plate arranged on a second main surface side of the first member and having a through hole; and
a side wall member connected with the second flat plate and the frame body and providing a pump chamber together with the first member and the second flat plate.

7. The actuator according to claim 5, wherein
the frame body has a concave portion concaved from the first main surface, and
the concave portion is overlapped with a side end portion of the second power supply member when viewed in the thickness direction.

8. The actuator according to claim 1, wherein the insulating layer is thinner than the piezoelectric element.

9. A fluid control device comprising:
the actuator according to claim 8;
a second flat plate arranged on a second main surface side of the first member and having a through hole; and
a side wall member connected with the second flat plate and the frame body and providing a pump chamber together with the first member and the second flat plate.

10. The actuator according to claim 8, wherein
the frame body has a concave portion concaved from the first main surface, and the concave portion is overlapped with a side end portion of the second power supply member when viewed in the thickness direction.

11. The actuator according to claim 8, further comprising:
an adhesive bonding the first power supply member to the frame body and having conductivity.

12. The actuator according to claim 1, wherein the second power supply member has a curved portion, the curved portion being separated from the piezoelectric element in the thickness direction, in a middle of an extending direction of the curved portion.

13. A fluid control device comprising:
the actuator according to claim 12;
a second flat plate arranged on a second main surface side of the first member and having a through hole; and
a side wall member connected with the second flat plate and the frame body and providing a pump chamber together with the first member and the second flat plate.

14. The actuator according to claim 12, wherein
the frame body has a concave portion concaved from the first main surface, and
the concave portion is overlapped with a side end portion of the second power supply member when viewed in the thickness direction.

15. The actuator according to claim 12, further comprising:
an adhesive bonding the first power supply member to the frame body and having conductivity.

16. The actuator according to claim 12, wherein the insulating layer is thinner than the piezoelectric element.

17. A method for manufacturing the actuator according to claim 1, comprising:
providing a connecting member connecting the first power supply member with the second power supply member,
integrally forming the first power supply member, the second power supply member, and the connecting member, and
after connecting the second power supply member to the piezoelectric element and connecting the first power supply member to the frame body, cutting off the first power supply member and the second power supply member from the connecting member.

18. The method for manufacturing the actuator according to claim 17, wherein
the first external connection terminal connects the first power supply member with the connecting member, and
the second external connection terminal connects the second power supply member with the connecting member.

19. The method for manufacturing the actuator according to claim 17, further comprising:
in a state in which the first power supply member, the second power supply member, and the connecting member are integrally formed, forming the insulating layer on the first power supply member and the second power supply member.

20. The method for manufacturing the actuator according to claim 19, wherein the insulating layer is formed by strip-shape coating or by attaching strip-shaped insulating tape.

* * * * *